United States Patent
Goodrich et al.

(10) Patent No.: US 6,798,210 B2
(45) Date of Patent: Sep. 28, 2004

(54) SPEED SENSITIVE FIELD GROUND DETECTION MODE FOR A GENERATOR FIELD WINDING

(75) Inventors: Gregory John Goodrich, Scotia, NY (US); Walter Joseph Kusaywa, Cohoes, NY (US)

(73) Assignee: General Electric Company, Schenectady, NY (US)

( * ) Notice: Subject to any disclaimer, the term of this patent is extended or adjusted under 35 U.S.C. 154(b) by 79 days.

(21) Appl. No.: 10/289,399

(22) Filed: Nov. 7, 2002

(65) Prior Publication Data

US 2004/0090228 A1 May 13, 2004

(51) Int. Cl.$^7$ .................. G01R 31/02; G01R 31/34; G01R 33/00
(52) U.S. Cl. .................. 324/510; 324/772; 324/262
(58) Field of Search .................. 324/509, 510, 324/513, 772, 545, 546, 654, 178, 179, 162

(56) References Cited

U.S. PATENT DOCUMENTS

| | | | |
|---|---|---|---|
| 3,506,914 A | * 4/1970 | Albright et al. | 324/546 |
| 3,727,123 A | * 4/1973 | Smith | 322/99 |
| 4,658,213 A | * 4/1987 | Finley | 324/772 |
| 4,667,148 A | 5/1987 | Albright et al. | 324/149 |
| 4,808,932 A | * 2/1989 | Schulz et al. | 324/545 |
| 6,466,009 B1 | * 10/2002 | Dehaan et al. | 324/207.11 |

OTHER PUBLICATIONS

Karmaker H. C., "Broken damper bar detection studies using flux probe measurements and time–stepping finite element analysis for salient–pole synchronous machines" SDEMPED 2003, 4th IEEE International Symposium, Aug. 24–26, 2003, pp.; 193–197.*
"Intertum Short–Circuit Detector For Turbine–Generator Rotor Windings", D.R. Albright, pp. 3–11, (1970).
"Detection of Shorted Turns in Generator Field Windings", GE Energy Services, pp. 1–2, (Feb. 2002).
"Generator Field Winding Shorted Turn Detector (Flux Probe)", GE Installation and Service Engineering *Steam Turbine*, pp. 1–21, (1991–1992).

* cited by examiner

*Primary Examiner*—Anjan K. Deb
(74) *Attorney, Agent, or Firm*—Nixon & Vanderhye P.C.

(57) ABSTRACT

A method for locating a speed sensitive ground condition in a field winding of an electromagnetic synchronous machine having a rotor and an excitation circuit, the method including: sensing a magnetic flux generated by the field winding, while accelerating the rotor and activating the excitation circuit; detecting a cyclical aberration in the magnetic flux occurring during revolution of the rotor, and determining a position in the field winding corresponding to the cyclical aberration and identifying that position as a location of the speed sensitive ground condition.

10 Claims, 4 Drawing Sheets

SPEED SENSITIVE FIELD GROUND DETECTION MODE FOR A GENERATOR FIELD WINDING

BACKGROUND OF THE INVENTION

The present invention relates to synchronous machine (generator) field windings and, in particular, to the detection of electrical field ground faults in generator field windings.

A field winding in a conventional generator is generally an arrangement of conductive wires or bars in a rotor. The field windings in the rotor are generally an annular array of conductive coil bars or cables (collectively coil bars) arranged in slots around the outer periphery of the rotor. The coil bars extend longitudinally along the length of the rotor and are connected by end turns at each end of the rotor. An exciter circuit applies DC (direct current) to the coils bars of the rotor.

The insulation separating the conductor bars or end turns of a rotor of the above type may break down and cause a short circuit, also referred to as a ground condition, across one or more coils of the winding. Short circuited coils may exist when the rotor is at a standstill or, alternatively, may only occur when the conductor bars or end of the rotor are outwardly loaded by centrifugal forces. Where a ground condition persists at standstill, the condition may be detected by static tests on the rotor. However, where the ground condition arises only when the rotor is under centrifugal load, the ground condition is speed sensitive and may only be detected with the rotor turning, such as at or near its operational speed.

In one potential failure condition, centrifugal forces may cause the coil components of the rotor field to encounter the field forging of the stator. When the rotating field windings make contact with the stationary field forging a short, i.e. ground condition, may result. This type of ground condition arises only when the rotor is spinning and hence the ground condition is said to be "speed sensitive".

When a speed sensitive ground condition occurs in a field winding, locating the ground, e.g. where the rotor rubs against the field windings, has in the past been particularly difficult. The point where the rotor rubs against the generator field windings must generally be located so that a specialist can correct the short and eliminate the ground fault condition.

A conventional technique for detecting a ground fault within a generator field winding or excitation system is to use existing instrumentation in place on the generator to notify the operator via an alarm. The instrumentation, e.g. a ground fault detector, monitors pulse and continuous voltages and currents on the rotating shaft and generates an alarm when a set point is reached. The setpoint is indicative of a ground fault condition. While the alarm notifies the operator that a ground condition may exist in the field winding, the alarm does not indicate whether the ground will occur while the rotor is stationary or only while the rotor is spinning and a under centrifugal load. The alarm also does not indicate where the ground has occurred in the generator. Conventional on-line ground fault detection systems, such as disclosed in U.S. Pat. No. 3,831,160, do not indicate the location of the ground fault in a winding or the excitation system of a generator, and do not indicate whether the ground is speed sensitive.

Locating the position of a non-speed sensitive ground fault is well known. If the ground condition exists regardless of whether the rotor is moving, then the location of the ground in the windings can be determined when the rotor is stopped. However, conventional techniques for locating a non-speed sensitive ground fault in a field winding when the rotor is at a standstill are not suitable for locating a speed sensitive ground fault. If the location of a speed sensitive ground fault in a field winding cannot be located, then a specialist may have no reliable means to locate the coil bar or pole at which the ground is located. When a speed sensitive ground fault occurs, the conventional repair technique has been to perform a full field rewind. A full field rewind is a time consuming and expensive procedure.

There is a long-standing, but previously unmet need for a testing technique to locate speed sensitive ground faults in a field winding. A test to determine the location of a speed sensitive ground would reduce of the cost of repairs and reduce the repair time needed for field windings in generators.

SUMMARY OF INVENTION

In one embodiment, the invention is to be able to detect speed sensitive shorts to ground in the direct current (DC) components of a synchronous machine (generator).

In another embodiment, the invention is a method for locating a speed sensitive ground condition in a field winding of an electromagnetic synchronous machine having a rotor and an excitation circuit, wherein the method includes: sensing a magnetic flux generated by the field winding, while accelerating the rotor and activating the excitation circuit; detecting a cyclical aberration in the magnetic flux occurring once per revolution of the rotor; determining a position in the field winding corresponding to the cyclical aberration and identifying that position as a location of the ground condition.

In a further embodiment, the invention is a method for locating a speed sensitive ground condition in an electromagnetic synchronous machine having a rotor with coil windings and a stator with armature windings, wherein the method includes the steps of: accelerating the rotor and applying excitation to the rotor coil windings; monitoring a signal from a flux probe instrument sensing slot flux leakage; detecting an aberration in the signal from the flux probe instrument which occurs once per revolution of the rotor; correlating the aberration in the signal from the flux probe instrument to an location of the rotor, and identifying the location of the rotor correlated with the aberration as a source of the speed sensitive ground condition.

DETAILED DESCRIPTION OF THE DRAWINGS

A new testing procedure has been developed to locate speed sensitive ground condition in a generator field winding. The testing procedure employs a standard flux probe 22, either a temporary probe or permanently fixed probe, which is an instrument that is already installed or is installable in a generator stator 14. The flux probe is conventionally used for the identification of turn-to-turn shorts in the generator field winding. With the present procedure, the flux probe 22 is used to identify the location of a turn-turn shorts in the coils of the generator field winding.

Figure 1:
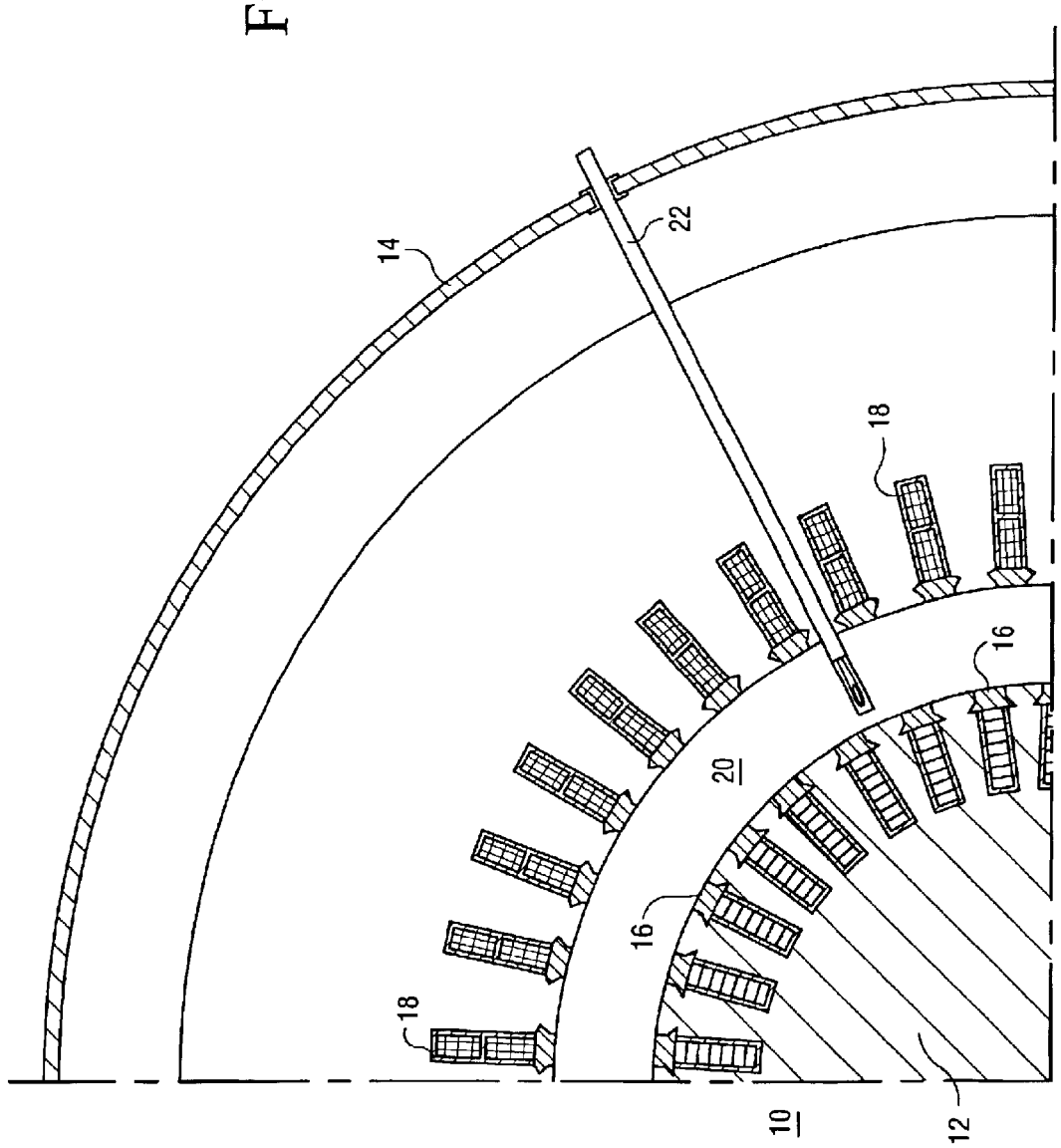
FIG. 1 is a cross-sectional diagram of a quarter section of a conventional generator having a stator winding, a rotor winding with a flux probe monitor.

FIG. 1 is a cross-sectional quarter view of a synchronous dynamo-electric machine 10 such as, for example, a large turbine-generator, that employs the interaction of magnetic fields in its rotor 12 and stator 14 to produce electric power. The high alternating current (AC) output power is conventionally generated in the stator winding 18 which operates as an armature. Pluralities of field windings 16 on the rotor 12 are conventionally excited by a direct current (DC) field supply. The DC field supply is generated either by an external DC exciter generator and fed through slip rings to the rotor field windings, or in a brushless generator-rectifier assembly rotating with the rotor.

Each of the field windings 18 of the armature may consist of a plurality of mutually insulated conductor bars or conductive cables disposed in slots in the stator 14. End turns are provided at the ends of the stator to interconnect the ends of the conductor bars or cables. Rotors 12 of large turbine-generators conventionally have two, four or more poles formed by the arrangement of the slots containing the field windings 16 and by the method of interconnection at the end turns. For purposes of illustration, a two-pole generator is described herein, although the invention is not limited to such an embodiment. The rotor windings are symmetrically arranged in the slots with respect to the pole axis and to form an annular array around the rotor. An annular gap 20 separates the rotor windings from the armature windings of the stator.

A flux probe 22 may extend radially through the stator and into the air gap. The flux probe may be permanently mounted in the stator or may be temporarily inserted into the air gap between the stator and rotor. The flux probe senses the field winding slot leakage flux. The leakage flux is indicative of the rotor movement and, in particular, the alternating passage of rotor windings and slots across the sensing field of the probe. The flux probe produces a voltage that is proportional to the rate of flux change as the rotor turns. If the ground is in the field winding, the flux probe signal should indicate the location of the fault in the stator field winding.

Figure 2:
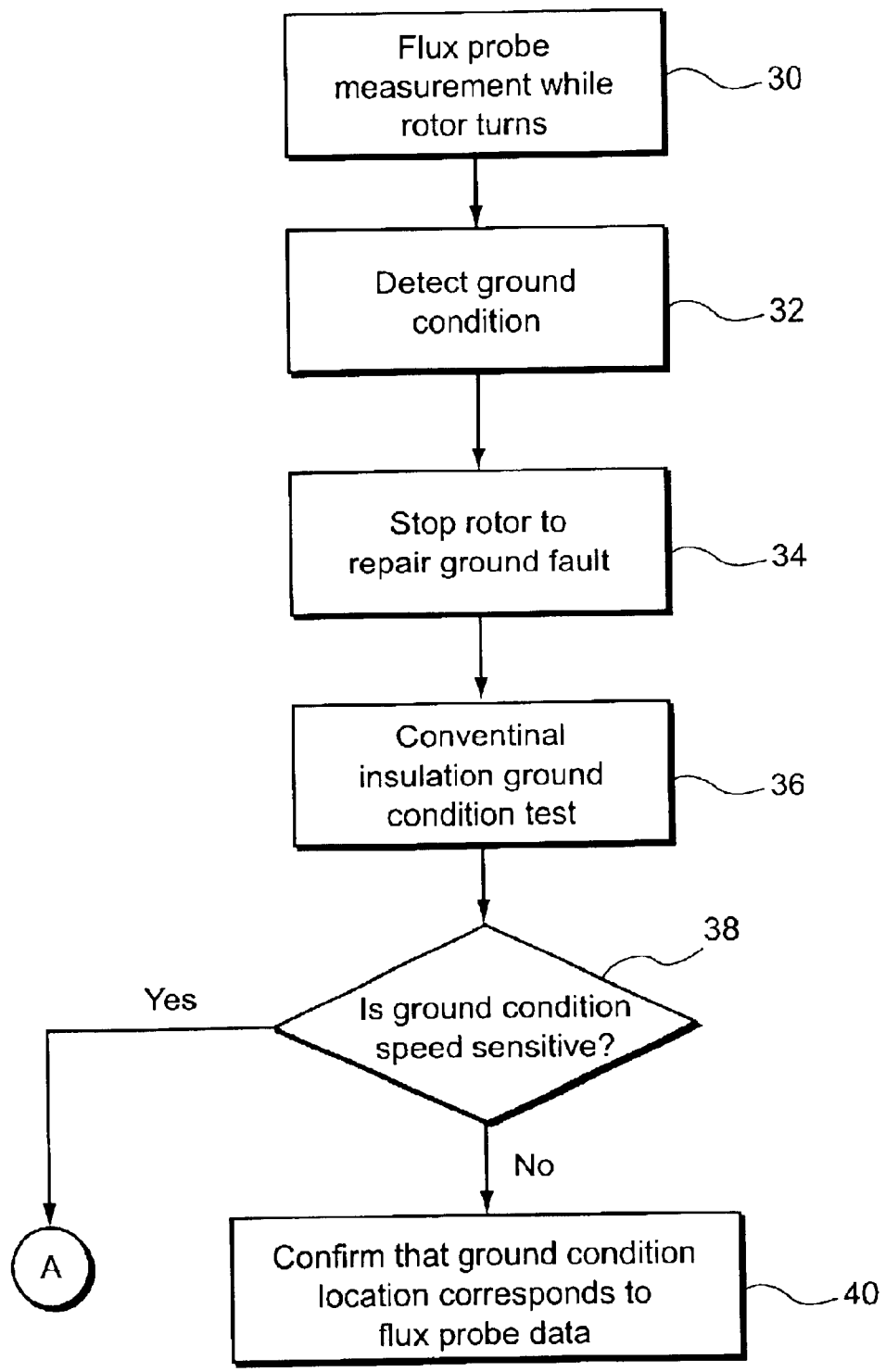
FIGS. 2 and 3 are flow charts showing exemplary steps for detecting the location of a ground fault.
Figure 3:
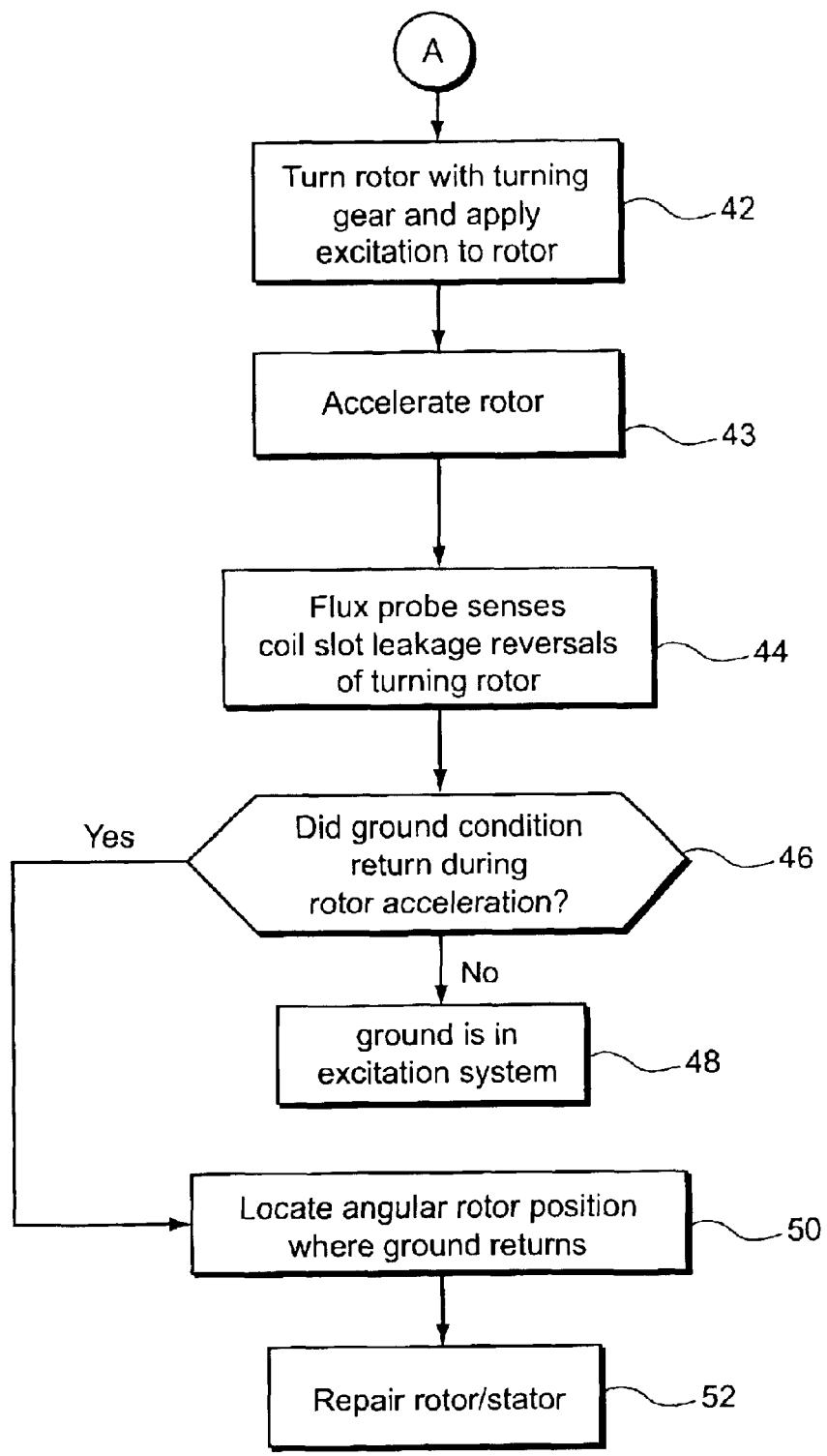

FIGS. 2 and 3 are of a flow chart of steps to locate a ground condition. The flux probe signal provides an indication of the magnetic flux around the stator, in step 30. A ground condition will cause an aberration in the magnetic flux field around the stator. The aberration in the flux field is sensed by the flux probe 22.

When a field ground condition occurs, a conventional ground detection system notifies the operator of the generator that a field short to ground has been detected, in step 32. A testing procedure is executed by a technician assigned to locate the source of the ground fault. As an initial step of this procedure, the generator is taken off-line and the rotor is stopped, in step 34.

Once the generator has reached a standstill, the field winding may be tested with a conventional insulation resistance test to determine the location of a ground fault in the stator field winding, step 36, to determine if the field ground fault exists in the field winding while the rotor is stopped. If the fault is not speed sensitive, step 38, then normal testing techniques are applied while the rotor is at a standstill to verify the field winding ground location. The location determined for the ground condition based on rotor standstill tests is compared the location determined based on the flux probe data to check whether a second (speed sensitive ground condition) exists, in step 40.

If insulation resistance test conducted while the rotor is stopped will indicates that no ground fault exists (despite the fact that the flux probe indicated a ground fault), then the ground fault is speed sensitive or is in the excitation system of the generator, in step 38. To determine whether a speed sensitive ground fault is present, the generator field rotor is placed on a turning gear, step 42, and field excitation is applied to the field winding as the rotor is accelerated. The field excitation is typically applied at a specified low rotor speed, and remains constant as the rotor is accelerated to its rated speed.

During rotor acceleration, step 43, the flux probe 22 is used to inspect the field windings. The signal from the flux probe should indicate normal coil slot leakage voltage reversals, in step 44, at slow rotor speeds while the ground condition has not yet reoccurred. These normal coil slot leakage signals are isolated and may be disregarded for purposes of detecting a speed induced ground fault.

If the ground is speed induced, a ground condition will occur as the rotor accelerates beyond some threshold speed, in step 46. The threshold speed may not be predetermined, and may vary for different ground conditions and generators. At the threshold speed, the centrifugal forces acting on the rotor become sufficiently great to cause the speed-sensitive ground to occur in the field windings. If the speed induced ground occurs at a single location where the field coils make contact with the rotor, then the ground will cause a cyclical aberration in the magnetic flux of the field winding. The cyclical flux aberration will occur once per revolution of the rotor.

However, if no speed induced ground occurs as the rotor accelerates to its rated speed, then the ground is most likely to be occurring in the excitation system and the testing procedure may focus on the excitation system, in step 48.

If the ground is speed induced, the flux probe will sense a cyclical flux aberration that occurs once-per-revolution of the rotor, in step 46. The once-per-revolution signal from the flux probe is acquired for purposes of data analysis and display. When a once-per-revolution signal is acquired with the flux probe signal, the location of the ground is determined, in step 50, by correlating the timing of the once-per-revolution flux probe signal to the angular position of the rotor. The turning gear system reports on the angular position of the rotor as the rotor spins. For example, an analysis of the once per revolution signal can determine the pole and coil in the field winding where the speed induced ground is occurring. The ground fault condition is repaired knowing its location, in step 52.

To assist in the flux probe signal analysis, the signal with the once-per-revolution behavior may be compared to an earlier flux probe signal taken when the rotor was at a speed below the threshold speed and before the ground occurred. By comparing the flux probe signal with the once-per-revolution signal to a similar flux probe signal taken off the generator before the rotor was accelerated sufficiently to cause the ground, the flux aberration due to the once-per-revolution signal can be used to identify the location of the ground.

Figure 4:
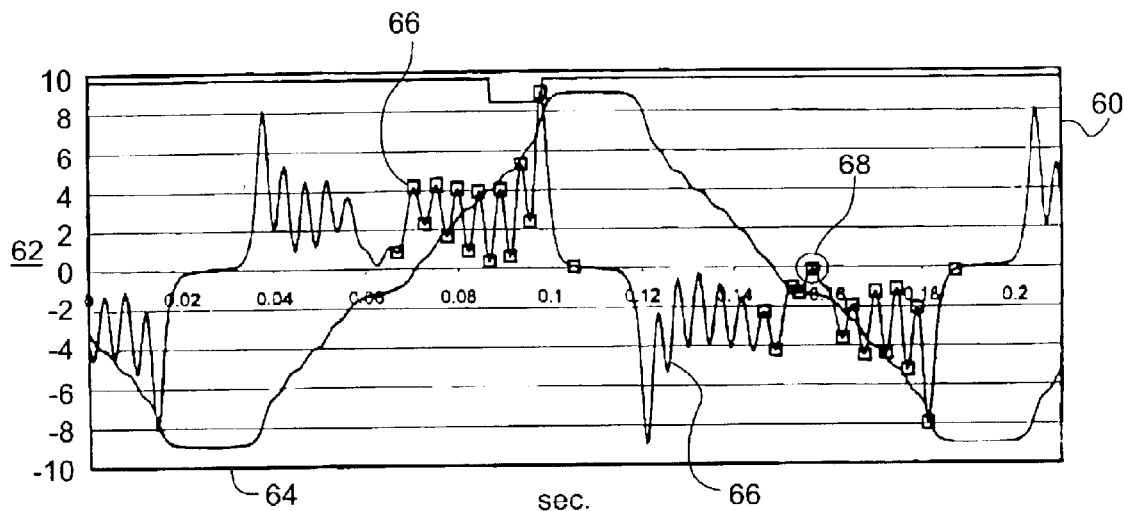
FIG. 4 is an exemplary chart of a flux probe signal of a rotor showing a speed induced ground develops.

FIG. 4 is an exemplary chart 60 of flux probe voltage 62 verses time 64. The flux probe data shows the normal slot leakage voltage reversals in voltage line 66. However, an aberration 68 in the flux probe data indicates a ground condition. This aberration will occur once per rotor revolution if the speed sensitive fault is due to a single ground fault condition. The aberration may occur more than once per revolution is there are more than one locations on the rotor where a speed sensitive fault exists. The location of a speed sensitive ground fault can be determined by correlating the timing of the aberration 68 in the flux probe signal to the rotor angular position.

Figure 5:
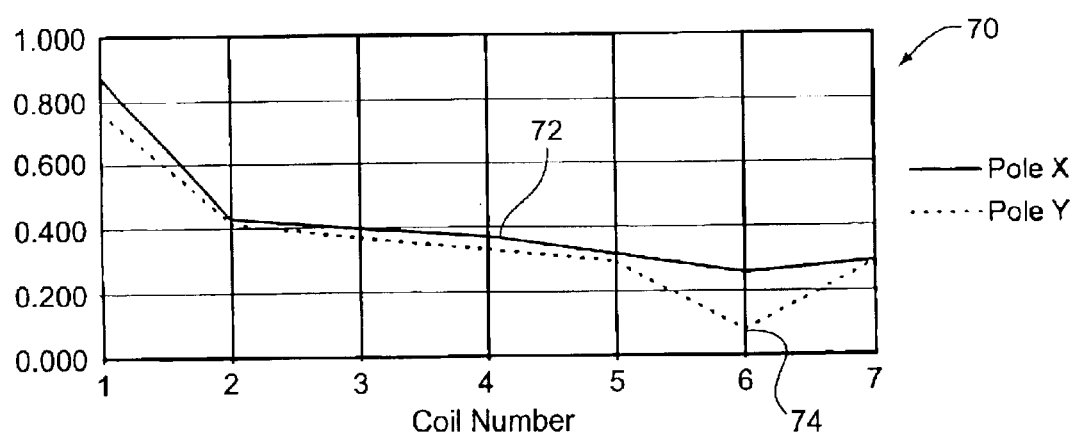
FIG. 5 is an exemplary chart of a normalize flux probe signal correlated to the rotor pole and slots.

FIG. 5 is a chart 70 showing the normalized slot amplitude flux probe voltage measurements 72 of the data shown in chart 60 (FIG. 4) for a two pole machine (X and Y poles). In absence of a ground condition, the normalized voltages for both poles should be similar. However, pole Y at coil 6 shows an aberration 74 in the slot flux leakage that indicates a ground condition in coil 6 at pole Y.

The ground may also be isolated by comparing a pre-ground flux probe signal with a flux probe signal, having the once-per-revolution ground induced flux signal. Having isolated the once-per-revolution ground signal, the rotational position of the ground may be determined because the angular position of the rotor is known with respect to the ground signal. Knowing the angle of the rotor that corresponds to the once-per-revolution signal due to the ground, the pole and coil in the field winding corresponding to the once-per-revolution signal may be identified. The pole and coil corresponding to the once-per-revolution signal are those where the speed sensitive ground is most likely to occur. After the rotor is stopped, the identified pole and coil may be inspected to confirm that a speed sensitive ground is occurring at that pole and coil.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for locating a speed sensitive ground condition in a field winding of an electromagnetic synchronous machine having a rotor and an excitation circuit, said method comprising:

a. sensing a magnetic flux generated by the field winding, while accelerating the rotor and activating the excitation circuit;

b. detecting a cyclical aberration in the magnetic flux occurring during acceleration of the rotor, and c. based on the aberration detected in the flux durina acceleration, determining a position in the field winding corresponding to the cyclical aberration and identifying that position as a location of the speed sensitive ground condition.

2. A method as in claim 1 further comprising identifying a flux variation due to normal coil slot leakage voltage before the rotor is accelerated to a threshold speed at which the cyclical aberration begins to occur.

3. A method as in claim 1 further comprising a step of determining the absence of a ground condition in the field winding while the rotor is stationary before detecting the cyclical aberration in the magnetic flux.

4. A method as in claim 1 wherein the identification of the ground condition location includes identification of the coil slot and pole location corresponding to the speed sensitive ground condition.

5. A method for locating a speed sensitive ground condition in an electromagnetic synchronous machine having a rotor with coil windings and a stator with armature windings, said method comprising:

a. accelerating the rotor with a turning gear and applying excitation to the rotor coil windings;

b. monitoring a signal from a flux probe instrument sensing slot flux leakage at a plurality of rotor speeds;

c. detecting an aberration in the signal from the flux probe instrument which occurs once per revolution of the rotor wherein the aberration in the signal is detected in a rotor speed that is faster that a slower rotor speed at which the signal is not detected;

d. correlating the aberration in the signal from the flux probe instrument to a location of the rotor, and e. identifying the location of the rotor correlated with the aberration as a source of the speed sensitive ground condition.

6. A method as in claim 5 wherein the location of the rotor is identified by a rotor coil and pole position.

7. A method as in claim 5 wherein the aberration of the signal occurs after the rotor is accelerated and is absent when the rotor is stopped or at a slow rotational speed.

8. A method as in claim 5 further comprising testing the rotor at a standstill for a non-speed sensitive ground condition before accelerating the rotor to detect the speed sensitive ground condition.

9. A method as in claim 5 further comprising: sensing a ground condition while the machine is operating; stopping the rotor; inspecting the armature windings for the ground condition, and determining that a ground condition is absent when the rotor is at a standstill, before performing steps (a) to (e).

10. A method as in claim 5 further comprising testing the rotor excitation system for a ground condition before performing steps (a) to (e).

* * * * *